US006432558B1

(12) United States Patent
Nabika et al.

(10) Patent No.: US 6,432,558 B1
(45) Date of Patent: Aug. 13, 2002

(54) SEMICONDUCTOR CERAMIC AND SEMICONDUCTOR CERAMIC DEVICE

(75) Inventors: Yasuhiro Nabika; Tetsukazu Okamoto, both of Omihachiman; Toshiharu Hirota, Hikone; Yoshitaka Nagao, Omihachiman, all of (JP)

(73) Assignee: Murata Manufacturing Co. Ltd. (JP)

(*) Notice: Subject to any disclaimer, the term of this patent is extended or adjusted under 35 U.S.C. 154(b) by 159 days.

(21) Appl. No.: 09/634,086

(22) Filed: Aug. 8, 2000

(30) Foreign Application Priority Data

Aug. 11, 1999 (JP) .......................................... 11-227386

(51) Int. Cl.[7] ......................... C04B 34/468; H01C 7/02; H01L 29/12; B32B 15/04

(52) U.S. Cl. ....................... 428/620; 428/632; 428/642; 428/649; 428/469; 501/137

(58) Field of Search ................................ 428/620, 632, 428/642, 649; 501/469, 137

(56) References Cited

U.S. PATENT DOCUMENTS 4,222,783 A * 9/1980 Atsumi et al.
4,598,055 A * 7/1986 Hennings et al.
5,082,811 A * 1/1992 Bruno
5,242,674 A * 9/1993 Bruno et al.
5,297,438 A * 3/1994 Alles et al.
5,686,367 A * 11/1997 Hayashi
5,939,972 A * 8/1999 Nagao et al.
6,284,216 B1 * 9/2001 Sakai et al.
6,352,681 B1 * 3/2002 Horikawa et al.

FOREIGN PATENT DOCUMENTS

EP 0727791 A3 8/1996
EP 0727791 A2 8/1996

* cited by examiner

*Primary Examiner*—Deborah Jones
*Assistant Examiner*—Jason Savage
(74) *Attorney, Agent, or Firm*—Dickstein, Shapiro, Morin & Oshinsky, LLP

(57) ABSTRACT

A semiconductor ceramic device comprises a body composed of a semiconductor ceramic having a positive resistance-temperature coefficient primarily composed of barium titanate and electrodes provided on the body, in which the resistance-temperature coefficient is 9%/° C. or more, resistivity is 3.5 Ω·cm or less, and withstand voltage is 50 V/mm or more. As the semiconductor ceramic forming the body provided in a thermistor having positive resistance-temperature characteristics, a semiconductor ceramic having a positive resistance-temperature coefficient is used, in which the semiconductor ceramic has an average particle diameter of about 7 to 12 μm and comprises barium titanate as a major component and sodium in an amount of about 70 ppm or less on a weight basis.

15 Claims, 1 Drawing Sheet

SEMICONDUCTOR CERAMIC AND SEMICONDUCTOR CERAMIC DEVICE

BACKGROUND OF THE INVENTION

1. Field of the Invention

The present invention relates to barium titanate semiconductor ceramics. More particularly, the present invention relates to a barium titanate semiconductor ceramic having a positive resistance-temperature coefficient and a semiconductor ceramic device using the same.

2. Description of the Related Art

Barium titanate semiconductor ceramics having positive resistance-temperature characteristics (PTC characteristics), in which resistivity at room temperature is low and resistance rapidly increases above a certain temperature (the Curie temperature), have been widely used in temperature control, current control, heating at constant temperature, and the like. Among these applications, an overcurrent protection device used for circuits having lower resistivity while being compact and having a high withstand voltage has been desired.

A conventional technique relating to the present invention is disclosed in Japanese Unexamined Patent Application Publication No. 8-217536. The conventional technique focuses on the sodium content contained in a barium titanate semiconductor ceramic and discloses that resistivity of a barium titanate semiconductor ceramic can be adjusted by adding 0.0005 to 0.02 percent by weight of sodium thereto. According to this conventional technique, when resistivity of a baked material changes due to the variation in baking temperature therefor, the resistivity of a finished semiconductor ceramic composition is adjusted by controlling the sodium content to range from 0.0005 to 0.02 percent by weight.

In addition, the publication discloses that the withstand voltage is decreased by adding sodium in an amount of 0.03 percent by weight or more.

The publication describing the conventional technique makes no reference to particle diameters of crystals contained in a semiconductor ceramic. However, when the desires for lower resistivity and a higher withstand voltage are focused on, the inventors of the present invention found that the resistivity and withstand voltage desired cannot always be obtained only by controlling the sodium content as described above.

SUMMARY OF THE INVENTION

Accordingly, it is an object of the present invention to provide a semiconductor ceramic having a positive resistance-temperature coefficient in addition to having lower resistivity and a higher withstand voltage, and to provide a semiconductor ceramic device using the semiconductor ceramic mentioned above.

The semiconductor ceramic of the present invention has a positive resistance-temperature coefficient and comprises barium titanate as a major component and sodium. In order to solve the technical problems described above, the average particle diameter of the semiconductor ceramic is about 7 to 12 μm and the sodium content is about 70 parts per million (hereinafter referred to as ppm) or less on a weight basis.

In addition, the present invention can be applied to a semiconductor ceramic device comprising a body composed of the semiconductor ceramic described above and electrodes disposed on the body.

DESCRIPTION OF THE PREFERRED EMBODIMENTS

Figure 1:
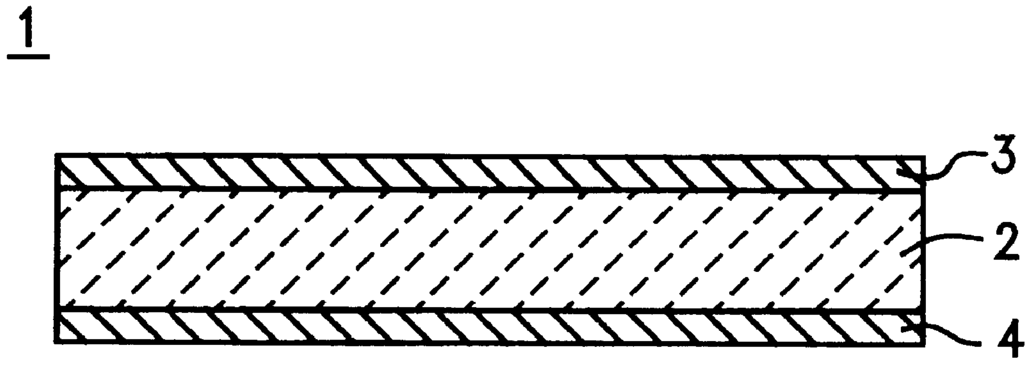
FIG. 1 is a cross-sectional view of a thermistor having positive resistance-temperature characteristics according to an embodiment of the present invention.

FIG. 1 is a cross-sectional view of a thermistor 1 having a positive resistance-temperature coefficient according to an embodiment of the present invention.

The thermistor 1 having positive resistance-temperature characteristics comprises a body 2 composed of a semiconductor ceramic having a positive resistance-temperature coefficient. The body 2 is, for example, a disk, and is provided with electrodes 3 and 4 on the main surfaces thereof.

In the thermistor 1 having positive resistance-temperature characteristics, the semiconductor ceramic forming the body 2 comprises barium titanate as a major component and sodium in an amount of about 70 ppm or less on a weight basis, in which the average particle diameter of the semiconductor ceramic is about 7 to 12 μm. In addition, as the electrodes 3 and 4, indium-gallium (In—Ga) electrodes can be used.

By using the semiconductor ceramic having the average particle diameter and the sodium content mentioned above, a thermistor 1 having positive resistance-temperature characteristics can be produced in which a resistance-temperature coefficient is relatively high, resistivity is relatively low, and withstand voltage is relatively high.

Hereinafter, the present invention will be described in detail with reference to examples performed so as to confirm the advantages described above.

EXAMPLES

In order to obtain semiconductor ceramics primarily composed of barium titanate, which are used for bodies in thermistors having positive resistance-temperature characteristics, $BaCO_3$, $TiO_2$, PbO, $SrCO_3$, $CaCO_3$, $Sm_2O_3$, $MnCO_3$ and $SiO_2$ containing various amounts of sodium impurities were prepared and wet-mixed so as to have predetermined compositions. The mixtures thus formed were then dehydrated, dried and baked at 1,150° C. Subsequently, a binder was added to each baked mixture and pellets were formed therefrom.

Next, the pellets were processed by mono-axial press molding, and the molded piece thus formed was baked at 1,350° C. in an $H_2/N_2$ reducing atmosphere or an $N_2$ neutral atmosphere and was then oxidized at a temperature of 1,150° C.

Through the steps thus described, bodies in the form of a disk 0.5 μm thick and 11.0 μm in diameter composed of semiconductor ceramic were obtained, which had various average particle diameters and various sodium contents as shown in Table 1. The particle diameter of a semiconductor ceramic was measured by a section method using a scanning electron microscope photograph of the surface of the body obtained. In addition, the sodium content was determined by an atomic absorption method.

In addition, in order to measure electric properties of the samples listed in Table 1, In—Ga electrodes were formed on two main surfaces of the body, and the resistivity at room temperature ($\rho_{25}$), the withstand voltage, and the resistance-temperature coefficient ($\alpha$) were measured. The resistance-temperature coefficient ($\alpha$) was obtained by the equation shown below;

$$\alpha=\{\text{In}(\rho_2/\rho_1)/(T_2-T_1)\}\times100(\%/^\circ\text{C.})$$

in which $\rho_1$, is resistivity of 10 times the resistivity at room temperature ($\rho_{25}$) and $T_1$ is the temperature thereof, and $\rho_2$ is resistivity of 100 times the resistivity at room temperature ($\rho_{25}$) and $T_2$ is the temperature thereof.

The resistivities at room temperature, withstand voltages, and resistance-temperature coefficients are shown in Table 1. In this Table, the samples marked with asterisks are out of the range of the present invention.

TABLE 1

| SAMPLE NO. | PARTICLE DIAMETER (μm) | SODIUM CONTENT (ppm) | RESISTIVITY (Ω · cm) | WITHSTAND VOLTAGE (V/mm) | RESISTANCE-TEMPERATURE COEFFICIENT (%/° C.) |
|---|---|---|---|---|---|
| *1 | 5.9 | 6 | 3.7 | 87 | 9.7 |
| 2 | 7.0 | 7 | 3.2 | 82 | 9.6 |
| 3 | 9.0 | 6 | 2.0 | 67 | 10.2 |
| 4 | 11.4 | 10 | 1.4 | 52 | 10.6 |
| *5 | 13.2 | 11 | 1.1 | 42 | 11.3 |
| 6 | 9.2 | 35 | 2.2 | 69 | 10.4 |
| *7 | 5.5 | 42 | 4.4 | 100 | 9.6 |
| *8 | 6.4 | 46 | 4.0 | 90 | 10.0 |
| 9 | 7.5 | 50 | 3.5 | 85 | 9.9 |
| 10 | 8.1 | 55 | 3.3 | 80 | 10.4 |
| 11 | 9.5 | 58 | 2.3 | 70 | 10.5 |
| 12 | 10.6 | 55 | 2.0 | 60 | 10.6 |
| 13 | 11.9 | 40 | 1.7 | 88 | 10.9 |
| *14 | 13.7 | 53 | 1.4 | 45 | 11.6 |
| *15 | 5.7 | 70 | 4.6 | 102 | 9.8 |
| *16 | 6.6 | 65 | 4.2 | 92 | 10.2 |
| 17 | 9.7 | 68 | 2.5 | 72 | 10.7 |
| 18 | 12.0 | 63 | 1.9 | 57 | 11.1 |
| *19 | 13.9 | 60 | 1.6 | 47 | 11.8 |
| *20 | 6.8 | 100 | 5.9 | 94 | 10.4 |
| *21 | 7.9 | 95 | 5.4 | 89 | 10.3 |
| *22 | 8.5 | 88 | 5.2 | 84 | 10.8 |
| *23 | 9.9 | 79 | 4.2 | 74 | 10.9 |
| *24 | 11.0 | 90 | 3.9 | 64 | 11.0 |
| *25 | 12.3 | 93 | 3.6 | 59 | 11.3 |
| *26 | 14.1 | 105 | 3.3 | 49 | 12.0 |

According to Samples 2 to 4, 6, 9 to 13, 17 and 18, which are in the range of the present invention, since the average particle diameters were about 7 to 12 μm, and the sodium contents were about 70 ppm or less on a weight basis, a thermistor having positive resistance-temperature characteristics could be obtained in which the resistivity was 3.5 Ω·cm or less, the withstand voltage was 50 V/mm or more, and the resistivity at room temperature was 9%/°C. or more.

In contrast, when the average particle diameter was less than about 7 μm, the resistivity was increased, and on the other hand, when the average particle diameter was more than about 12 μm, the withstand voltage was decreased. Specifically, as can be seen in Samples 1, 7, 8, 15 and 20, when the average particle diameter was less than about 7 μm, the resistivity exceeded 3.5 Ω·cm. In contrast, as can be seen in Samples 5, 14, 19 and 26, when the average particle diameter was more than about 12 μm, the withstand voltage was less than 50 V/mm.

In addition, when the sodium content exceeded about 70 ppm on a weight basis, the resistivity was likely to increase. Specifically, as can be seen in Samples 20 to 25, when the sodium content exceeded about 70 ppm, the resistivity exceeded 3.5 Ω·cm.

In the semiconductor ceramic forming the body, when the average particle diameter and sodium content are in the range as specified above, resistivity of 3.5 Ω·cm or less and a withstand voltage of 50 V/mm or more can be realized.

As has thus been described, the semiconductor ceramic having positive resistance-temperature characteristics of the present invention comprises barium titanate as a major component and sodium in an amount of about 70 ppm or less on a weight basis, in which the average particle diameter of the semiconductor ceramic is 7 to 12 μm. Accordingly, in the semiconductor ceramic device comprising the body composed of the semiconductor ceramic and the electrodes provided thereon, resistivity of 3.5 Ω·cm or less and a withstand voltage of 50 V/mm or more can be realized while a resistance-temperature coefficient of 9%/°C. or more is achieved.

What is claimed is:

1. A semiconductor ceramic having a positive resistance-temperature coefficient comprising barium titanate, wherein the semiconductor ceramic contains sodium in an amount of about 70 parts per million or less on a weight basis and has an average particle diameter of about 7 to 12 μm.

2. The semiconductor ceramic having a positive resistance-temperature coefficient of claim 1, wherein the semiconductor ceramic contains sodium in an amount of about 68 parts per million or less on a weight basis and has an average particle diameter of 7 to 12 μm.

3. The semiconductor ceramic having a positive resistance-temperature coefficient of claim 1, wherein the semiconductor ceramic contains sodium in an amount of about 58 parts per million or less on a weight basis and has an average particle diameter of 7.5 to 11.9 μm.

4. A semiconductor ceramic device comprising a body comprising a semiconductor ceramic according to claim 3, and an electrode on the body.

5. The semiconductor ceramic device of claim 4, wherein the device is an overcurrent protection device.

6. The semiconductor ceramic device of claim 5, wherein the electrode is In—Ga.

7. The semiconductor ceramic device of claim 4, wherein the electrode is In—Ga.

8. A semiconductor ceramic device comprising a body comprising a semiconductor ceramic according to claim 2, and an electrode on the body.

9. The semiconductor ceramic device of claim 8, wherein the device is an overcurrent protection device.

10. The semiconductor ceramic device of claim 9, wherein the electrode is In—Ga.

11. The semiconductor ceramic device of claim 8, wherein the electrode is In—Ga.

12. A semiconductor ceramic device comprising a body comprising a semiconductor ceramic according to claim 1, and an electrode on the body.

13. The semiconductor ceramic device of claim 12, wherein the device is an overcurrent protection device.

14. The semiconductor ceramic device of claim 13, wherein the electrode is In—Ga.

15. The semiconductor ceramic device of claim 12, wherein the electrode is In—Ga.

* * * * *